(12) United States Patent
Peng et al.

(10) Patent No.: US 7,504,723 B2
(45) Date of Patent: *Mar. 17, 2009

(54) ELECTRICAL CONNECTION PATTERN IN AN ELECTRONIC PANEL

(75) Inventors: Wen-Hui Peng, Hsinchu Hsien (TW); Yu-Ching Chen, Taichung (TW)

(73) Assignee: AU Optronics Corporation, Hsinchu (TW)

(*) Notice: Subject to any disclaimer, the term of this patent is extended or adjusted under 35 U.S.C. 154(b) by 314 days.

This patent is subject to a terminal disclaimer.

(21) Appl. No.: 11/445,966

(22) Filed: Jun. 1, 2006

(65) Prior Publication Data

US 2007/0029658 A1 Feb. 8, 2007

Related U.S. Application Data

(63) Continuation-in-part of application No. 11/198,117, filed on Aug. 4, 2005.

(51) Int. Cl.
*H01L 23/48* (2006.01)
(52) U.S. Cl. .................... 257/735; 438/611
(58) Field of Classification Search ............ 27/735
See application file for complete search history.

(56) References Cited

FOREIGN PATENT DOCUMENTS

| JP | 03-097238 | 4/1991 |
|---|---|---|
| JP | 05-062978 | 3/1993 |
| JP | 2000-137239 | 5/2000 |
| JP | 2003-057677 | 2/2003 |

*Primary Examiner*—Thao X Le
*Assistant Examiner*—Kimberly Trice
(74) *Attorney, Agent, or Firm*—Ware, Fressola, Van Der Sluys & Adolphson, LLP

(57) ABSTRACT

A connector layout for arranging a plurality of parallel electrical connectors between two electronic devices. In one device, each connector has a strip connected to a bump pad. The bump pad is superimposed on and electrically connected to a bump pad on the other device. Each strip has a certain required strip width and each bump pad has a certain required pad width. The connectors are grouped into a group of three or more. Within each group, a strip is connected to a bump pad along one side edge thereof, and the bump pads are offset in two directions such that after the bump pads are superimposed, the pattern of the connected connectors in each group of connectors resembles a plurality of zigzag paths offset to maintain a constant gap between two strips. As such, the gap between two connectors can be minimized.

14 Claims, 13 Drawing Sheets

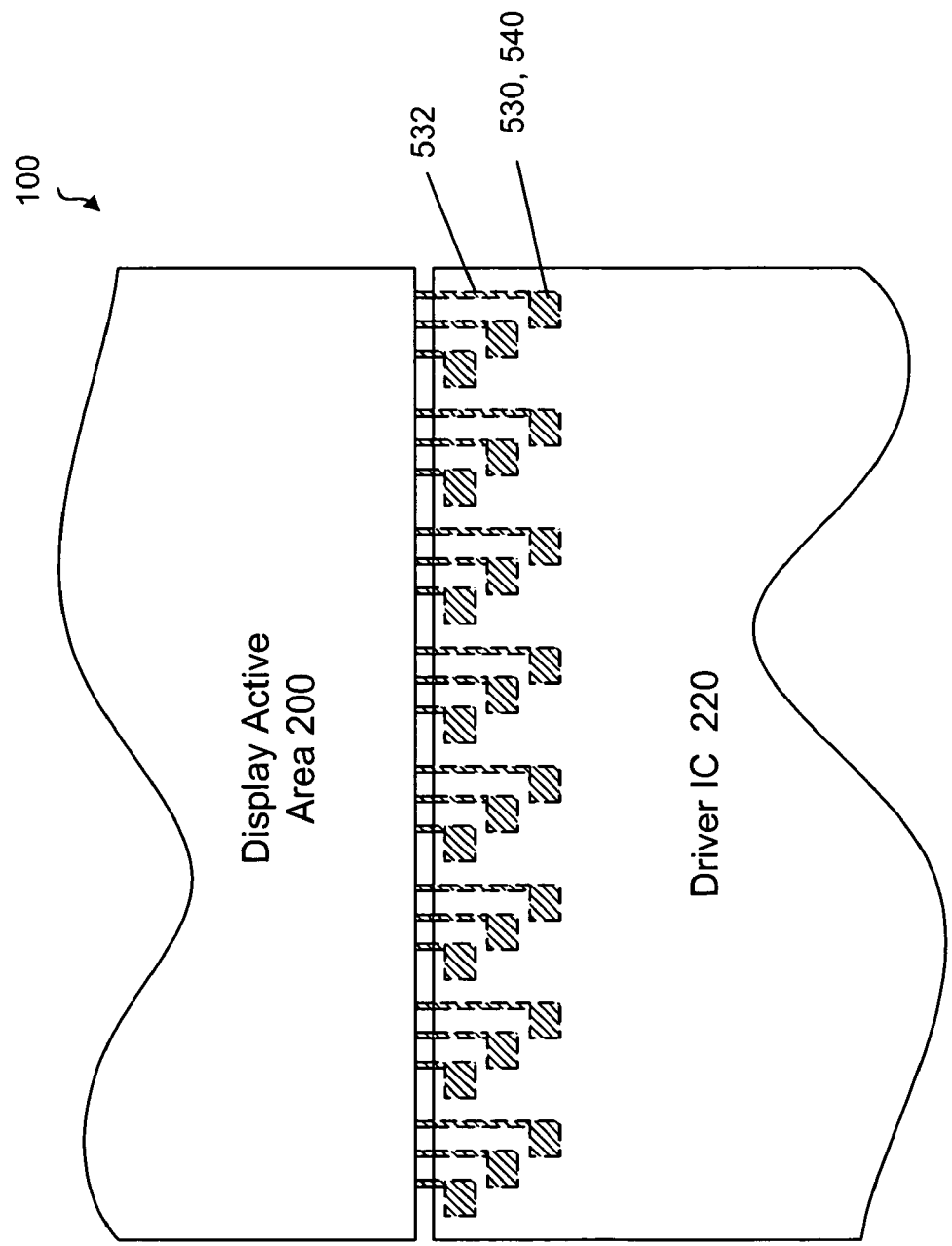

_US 7,504,723 B2_

ELECTRICAL CONNECTION PATTERN IN AN ELECTRONIC PANEL

This is a continuation-in-part application of and claims priority to a co-pending U.S. patent application Ser. No. 11/198,117, filed Aug. 4, 2005, assigned to the assignee of this application.

FIELD OF THE INVENTION

The present invention relates generally to electrical connections between two devices in an electronic panel and, more specifically, to the electrical connections between a display device and a driving device.

BACKGROUND OF THE INVENTION

In a display panel comprising a display device and a driving device, electrical connections between the display device and the driving device are usually designed to maximize the number of connectors within an available real-estate between the two devices. In a liquid crystal display (LCD) panel, for example, a gate driver and a data driver are electrically connected to an LCD device in order to operate the LCD device (see FIG. 1).

A thin-film transistor liquid-crystal display (TFT-LCD) is a type of flat-panel liquid-crystal display (LCD) device composed of an array of pixels. Each pixel is controlled by a gate line and a data line. As shown in FIG. 1, the TFT-LCD device 200 is composed of an array of pixels 210 and is controlled by a data line driver IC 230 and a gate line driver IC 220. In FIG. 1, $G_1, G_2, \ldots, G_m$ are gate lines and $D_1, D_2, \ldots, D_n$ are data lines. Preferably, both the driver ICs and the TFT-LCD device are disposed on the same glass substrate. After fabricating the TFT-LCD device on the glass substrate, driver ICs are mounted on the substrate via a so-called chip-on-glass (COG) process. Each of the driver ICs and the LCD device has a plurality of connectors so as to provide the electrical connections between each of the driver ICs and the LCD device.

FIG. 2 only shows the electrical connections between the active area of the LCD device 200 and a driver IC 220, as established by the COG process, for example. As shown in FIG. 2, the connectors on the active area of the display device 200 include a plurality of conductive strip segments 332 connected to a plurality of bump pads 330. The bump pads 330 are wider than the strip segments 332. As shown in FIG. 2, the connectors on the driver IC 220 include a plurality of bump pads 340 disposed on the underside the driver IC 332. The bump pads 340 are complementary to the bump pads 330. When these connectors are connected together to provide electrical connections between the display device and the driver IC, each of the bump pads on the driver IC is superimposed on a corresponding bump pad on the display device.

Referring to FIG. 3, as commonly seen in prior art, bump pads are arranged in a shifted pattern 350 so as to increase the number of bump pads in a unit length while maintaining a suitable distance between the two connectors. A typical completed display panel is shown in FIG. 3. As shown, the display panel 10 has a gate driver IC 220 and a data driver IC 230 electrically connected to active area of the LCD device 200. The panel also has a strip of wires-on-glass 270 and a strip of wires-on-glass 272 separately connecting the gate driver IC 220 and the data driver IC 230 to a bonding tape 260 so as to provide electrical connection to a PCB 250 or the like. The shifted pattern 350 of the electrical connections is shown in detail in FIG. 4.

As shown in FIG. 4, the width of the bump pad is $W_1$ and the length of the bump pad is $W_5$. A gap $W_4$ is kept between two adjacent bump pads. The thickness of the strip segment is $W_3$. Given a pitch P between two connectors, the shortest distance between two connectors is $W_2$, which can be determined as follows:

$$P = W_2 + (W_1 + W_3)/2$$

Due to the mechanical tolerance in the bump pad superimposing process, the acceptable smallest gap between two connectors is about 7 μm. If $W_1$=23 μm, $W_2$=7 μm and $W_3$=5 μm, we have a pitch P=21 μm.

The demand for higher resolutions in display devices heightens the requirement for having more signal channels on a given area of the substrate. This means that the pitch should be reduced if possible. However, the width of the bump pad, $W_1$, should not be further reduced, because the total area of the bump pad, $W_1 \times W_5$, should preferably be at least 2000 μm² to provide a good electrical connection between a bump pad of the IC and a corresponding bump pad of the display device.

Thus, it is advantageous and desirable to improve the bump pad layout pattern so that the pitch can be reduced without changing the width of the bump pads or the width of the strip segments while maintaining the minimum distance W2 between two adjacent connectors.

SUMMARY OF THE INVENTION

The present invention provides an efficient connector layout for arranging a plurality of parallel electrical connectors between two electronic devices on an electrical panel. The layout of the connectors on one electronic device is complementary to the layout of the connectors on the other electronic device. Each connector on one of the electronic devices has a strip connected to a bump pad. Each strip has a certain required strip width and each bump pad has a certain required pad width. Each bump pad on one electronic device is superimposed on a corresponding bump pad on the other device so as to provide electrical connection between the devices. The present invention connects a strip to a bump pad in a certain way and arranges the bump pads in a certain pattern so that, given a certain pitch, the gap between two connectors can be minimized. In particular, the connectors are grouped into a group of three or more. Within each group, a strip is connected to a bump pad along one side edge of the bump pad, and the bump pads are offset in two directions. After the bump pads are electrically connected by superimposition, the pattern of the connected connectors in each group of connectors resembles a plurality of zigzag paths offset to maintain a constant gap between two strips.

The present invention will become apparent upon reading the description taken in conjunction with FIGS. 5-13.

BRIEF DESCRIPTION OF THE DRAWINGS

The above and other objects, features and advantages of the present invention will become apparent from a consideration of the subsequent detailed description presented in connection with accompanying drawings, in which:

FIG. 6a is a top view showing the bump pads of the driver IC is electrically connected to bump pads on the active area of a display device;

DETAILED DESCRIPTION OF THE INVENTION

Figure 5:
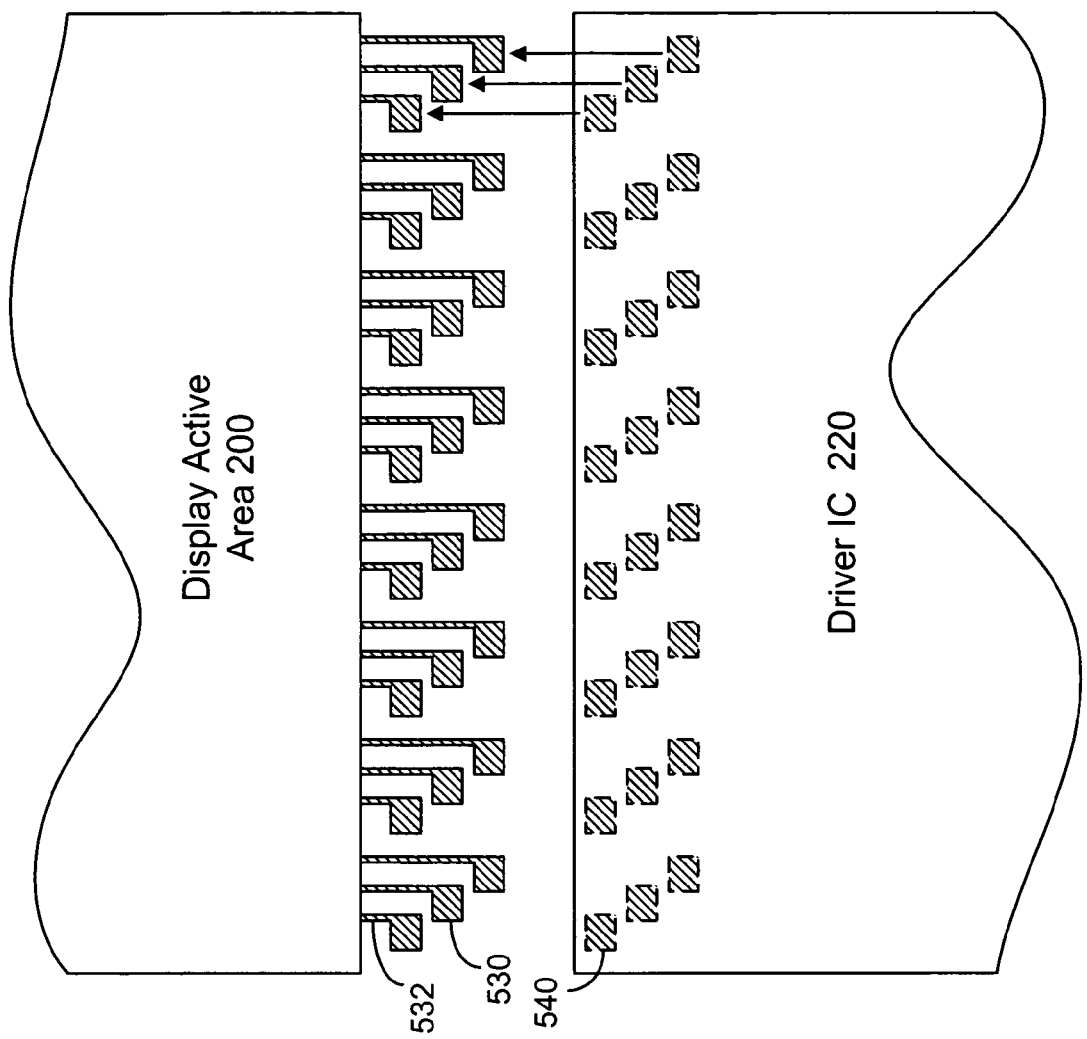
FIG. 5 is schematic representation of the electrical connectors, according to the present invention.

FIG. 5 shows the electrical connectors on the devices, according to the present invention. As shown, the connectors on the active area of a display device 200 include a plurality of conductive strip segments 532 connected to a plurality of bump pads 530. The bump pads 530 are wider than the strip segments 532. As shown in FIG. 5, the connectors on the driver IC 220 include a plurality of bump pads 540 disposed on the underside of the driver IC 220, complementary to the bump pads 530.

Figure 6B:
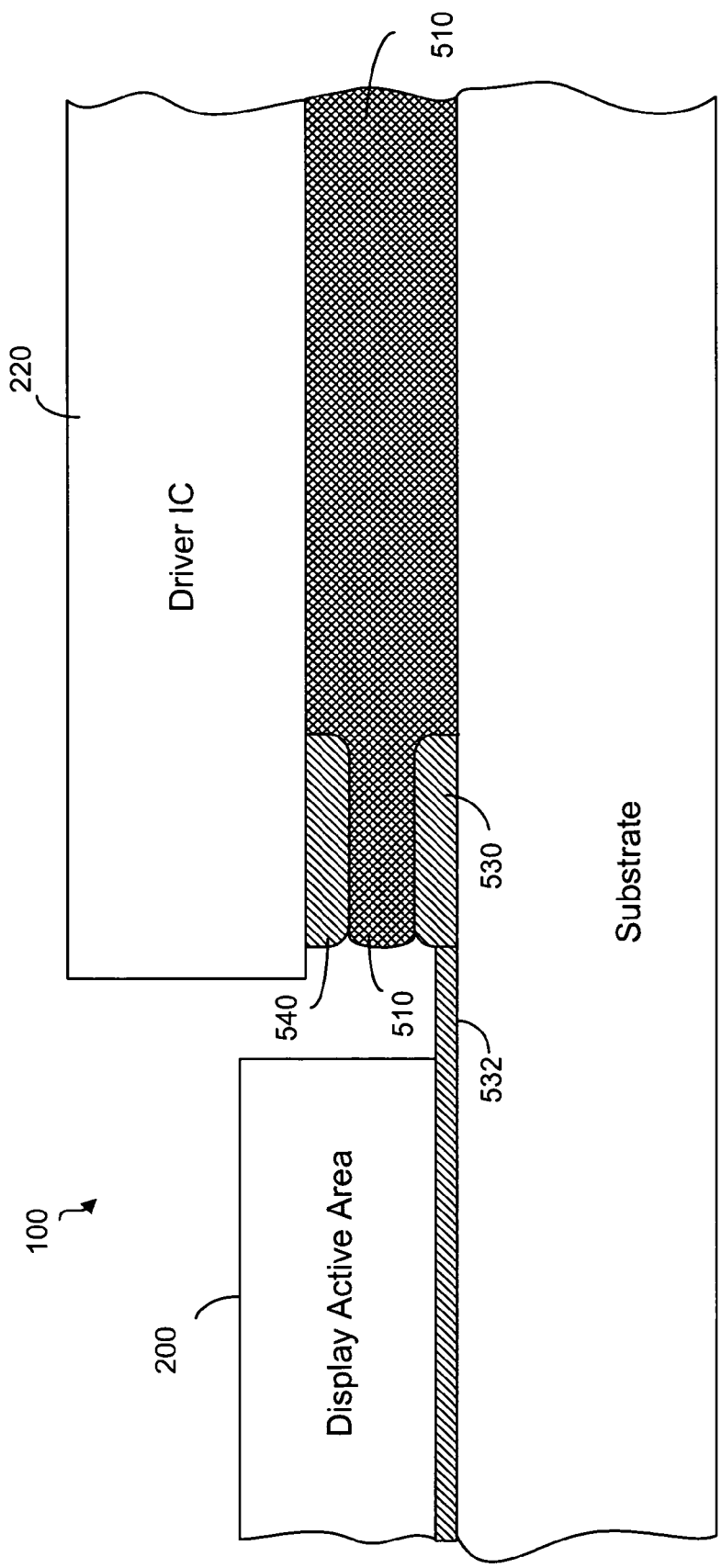
FIG. 6b is a cross sectional view showing the electric connection between the driver IC and the active area.

In connecting the connectors on the active area of the display device 200 to the connectors on the driver IC 220, a bump pad 540 on the driver IC 220 is superimposed on a corresponding bump pad 530 on the active area of the display device 200, and an electrically conductive medium, such as an anisotropic conductive film (ACF) 510 is provided between the bump pad 540 and the bump pad 530, as shown in FIG. 6a and FIG. 6b. FIG. 6b shows that the electrically conductive medium 510 is provided between the active area of the driver IC 200 and the substrate. The bump pad 530, the strip segment 532 and the active area of the display device 200 are typically fabricated on a glass substrate 500. The driver IC 220 is mounted on the substrate via a COG process. As is known in the art, an ACF contains a plurality of electrically conductive particles surrounded by a non-conductive medium. Normally, the ACF is not electrically conductive. But when the ACF is pressed, the electrically conductive particles become connected to each other to form a plurality of conductive paths between its upper surface and its lower surface.

Figure 7:
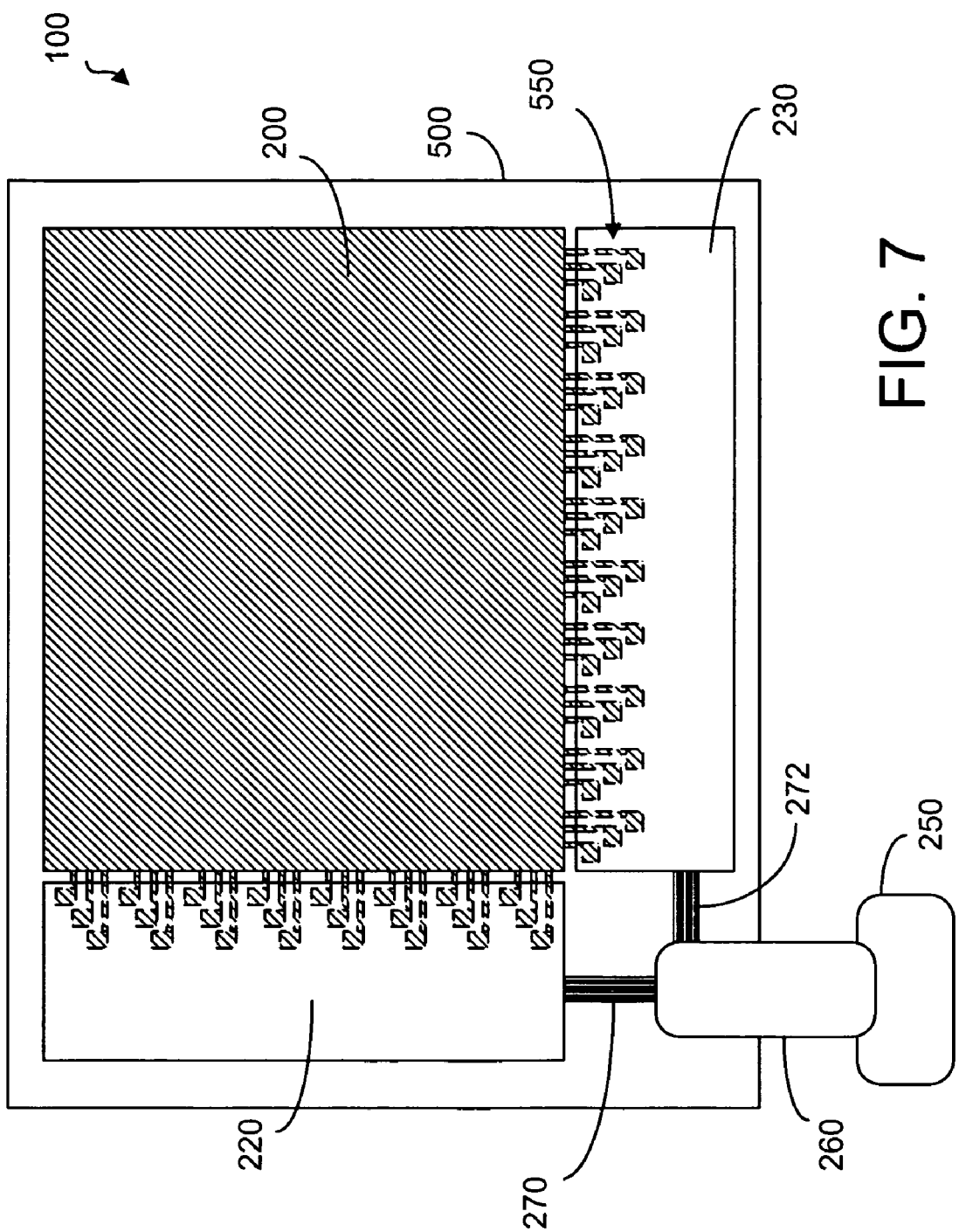
FIG. 7 shows a finished LCD panel with the bump pad layout, according to the present invention.

A finished display panel is shown in FIG. 7. As shown, the electrical connections between the driver IC 230 and the active area of the display device 200 have a connection pattern 550. Likewise, the electrical connections between the IC 220 and the active area of the display device 200 have a similar pattern. While the connection pattern 550 requires more area on the substrate 500, the closest distance $W_2$ between two adjacent connectors is greater than the closest distance $W_2$ in the prior art layout.

Figure 1:
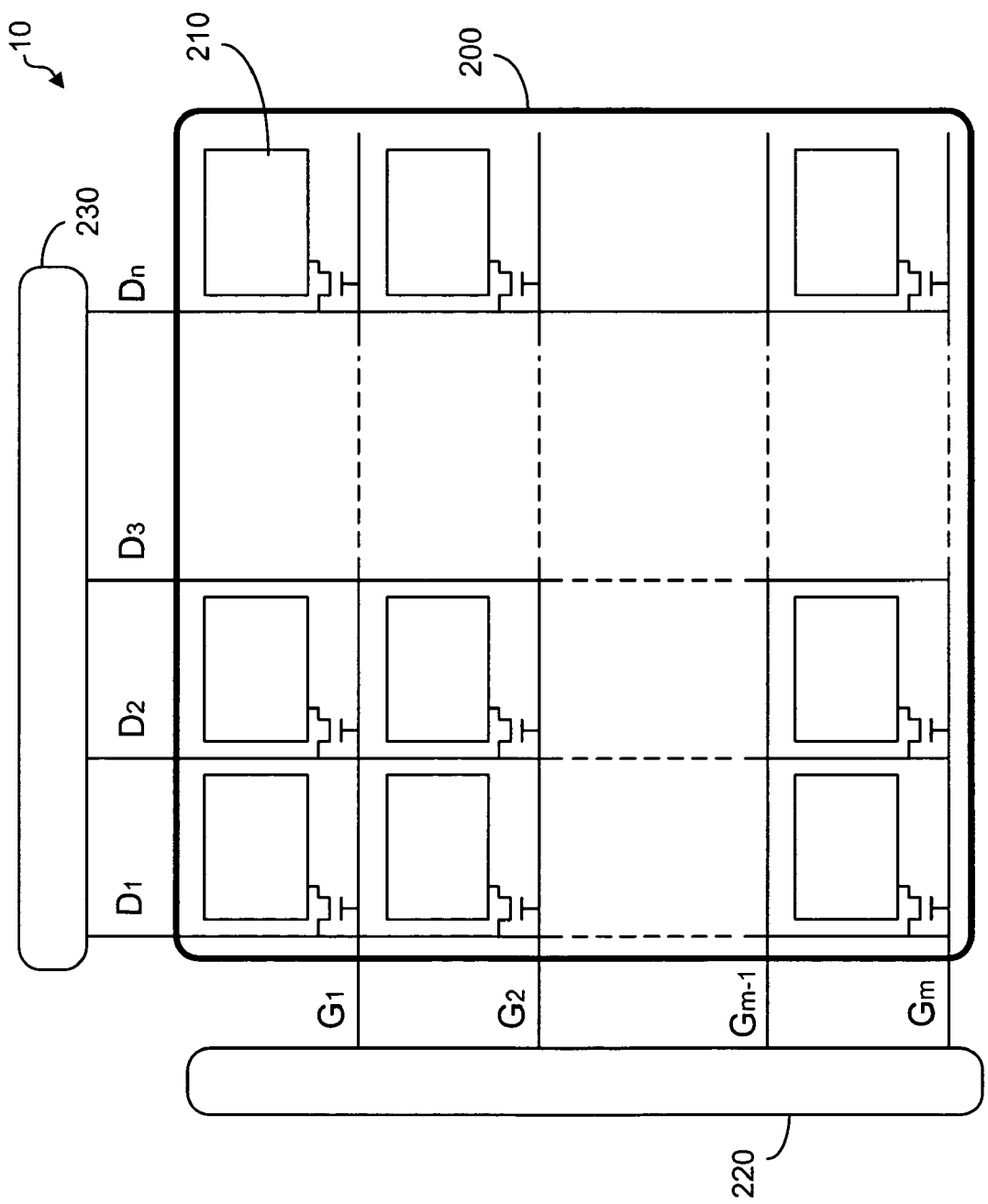
FIG. 1 is a schematic representation of an LCD panel having an LCD device connected to a gate driver IC and a data driver IC.
Figure 2:
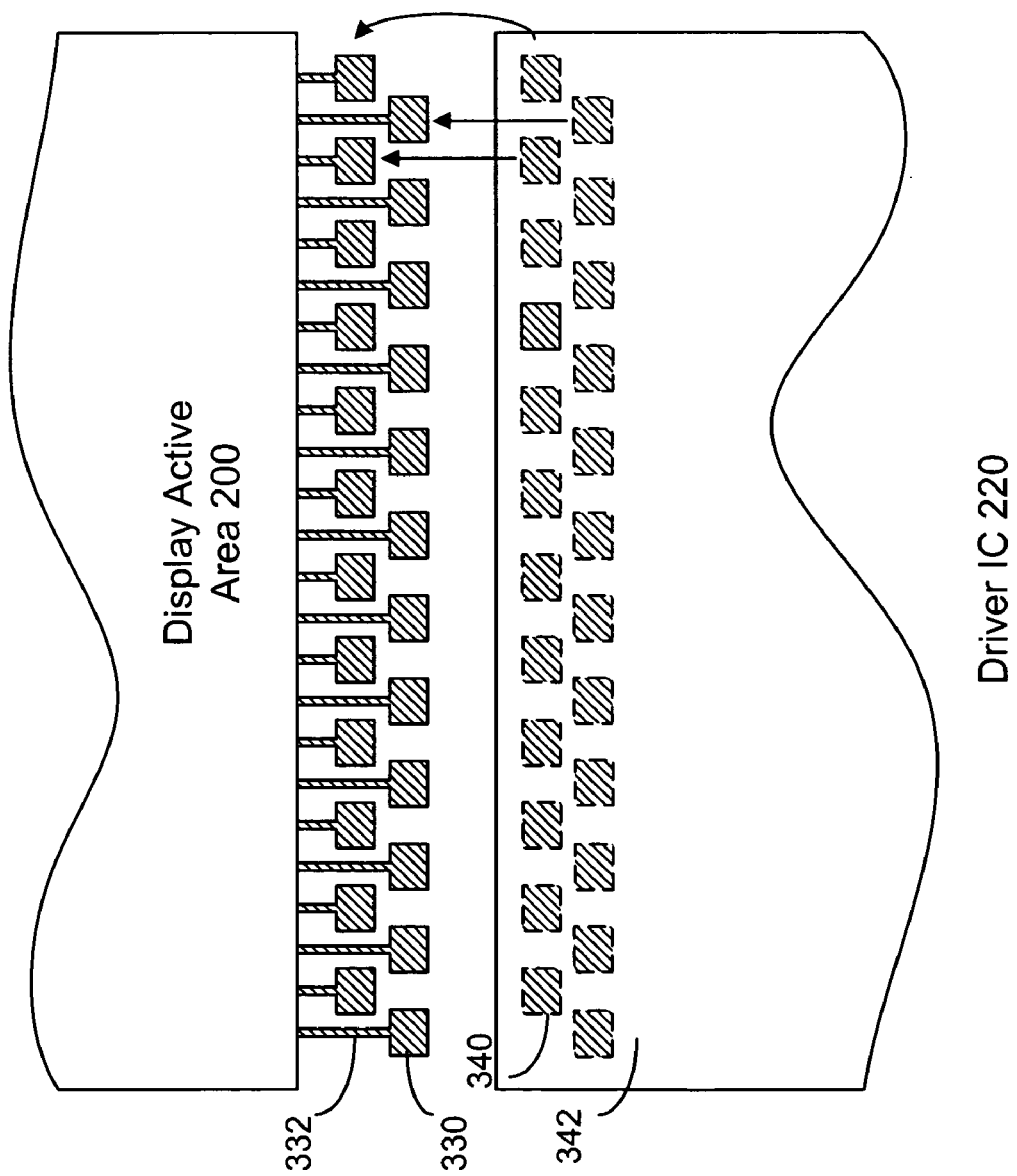
FIG. 2 is a schematic representation of the electrical connectors, according to prior art.
Figure 3:
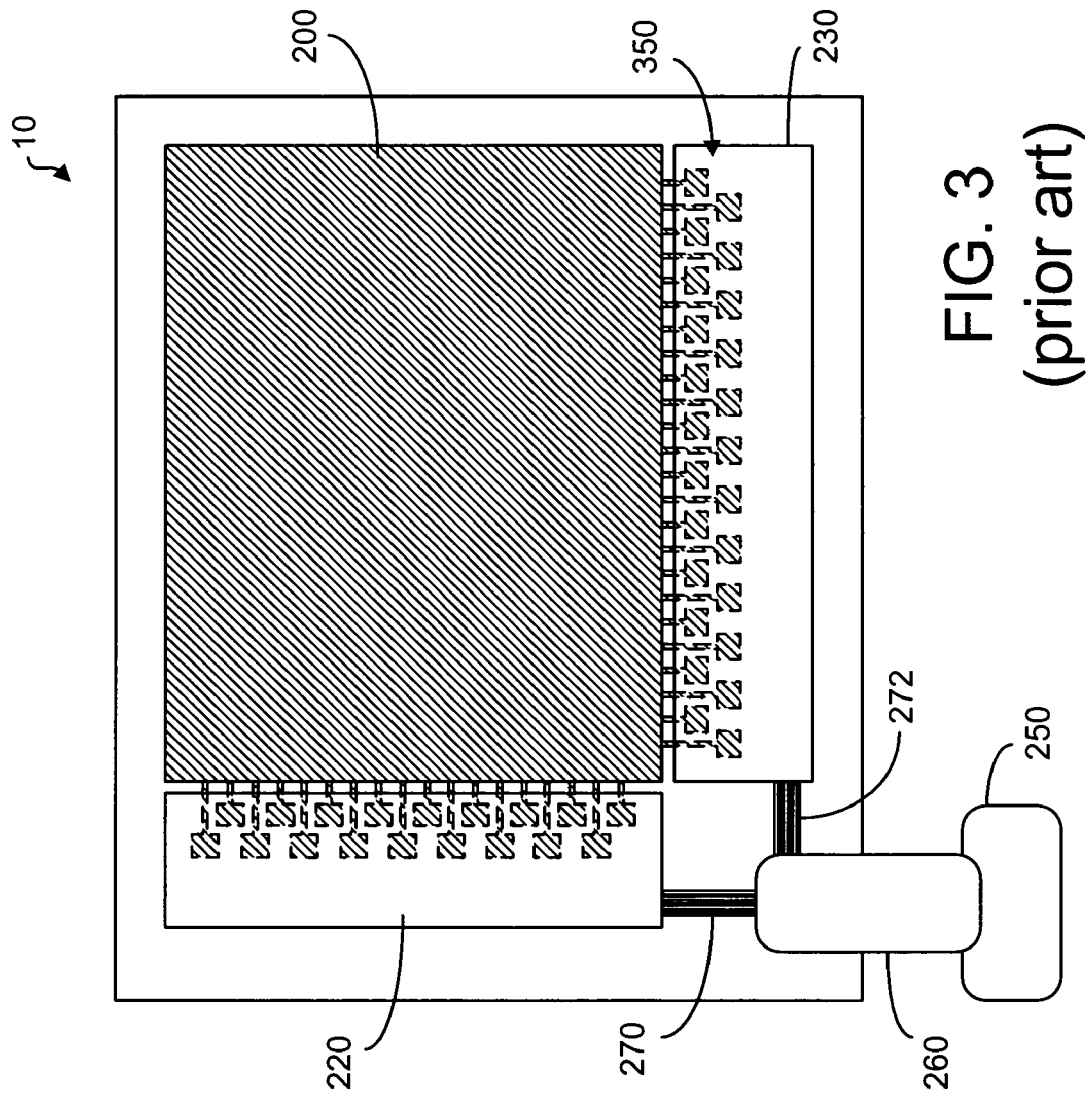
FIG. 3 shows a typical finished LCD panel with a prior-art bump pad layout.
Figure 8:
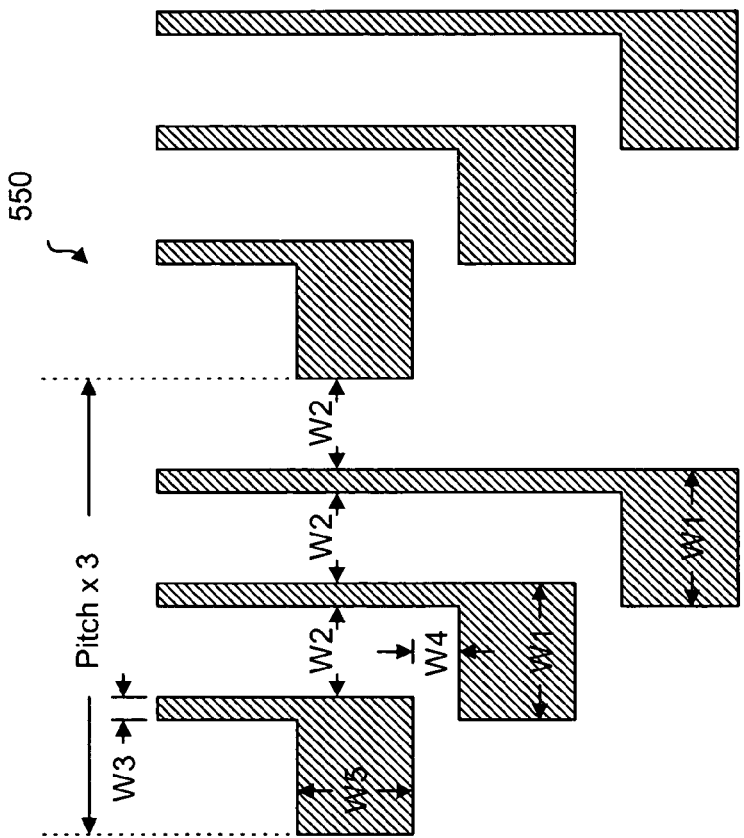
FIG. 8 shows the various dimensions in the bump-pad layout, according to the present invention.

In particular, the connected connectors are arranged in groups of three connectors, as shown in FIG. 8. As such, the relationship between the pitch, P, and other dimensions $W_1$, $W_2$ and $W_3$ is given below:

$$P=(W_1+3\times W_2+2\times W_3)/3.$$

Figure 4:
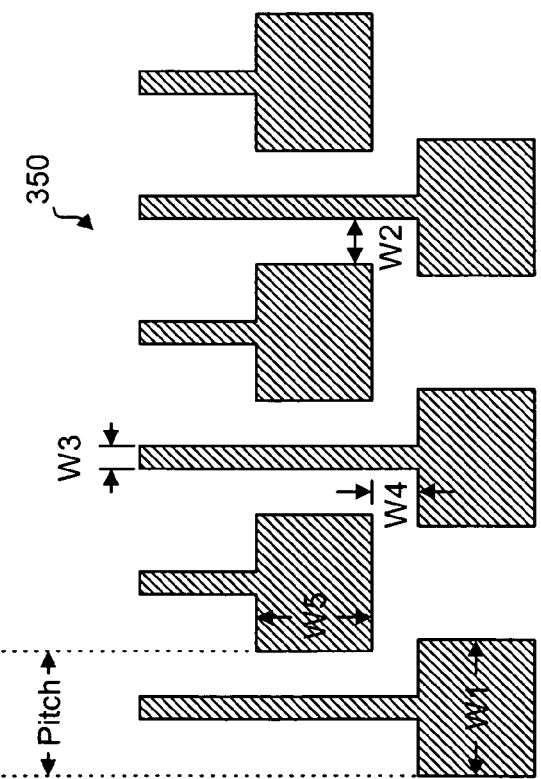
FIG. 4 shows the various dimensions in a prior art bump pad layout.

If we maintain the same dimensions in P, $W_1$ and $W_3$ as in the connection pattern 350 as shown in FIG. 4, with P=21 μm, $W_1$=23 μm, and $W_3$=5 μm, we have $$W_2=(3\times P-W_1-2\times W_3)/3=10 \text{ μm}.$$

Thus, with the same pitch, bump pad width and the strip segment width, the closest gap between two connectors is increased from 7 μm to 10 μm in this case. With such a connection pattern, the mechanical tolerance in superimposing the bump pads can be loosened. However, if the minimum gap $W_2$=7 is used, the pitch can be reduced from 21 μm to 18 μm, a 14% reduction. In other words, using the connection pattern 550, it is possible to fabricate more lines on a given width of the substrate.

Figure 9:
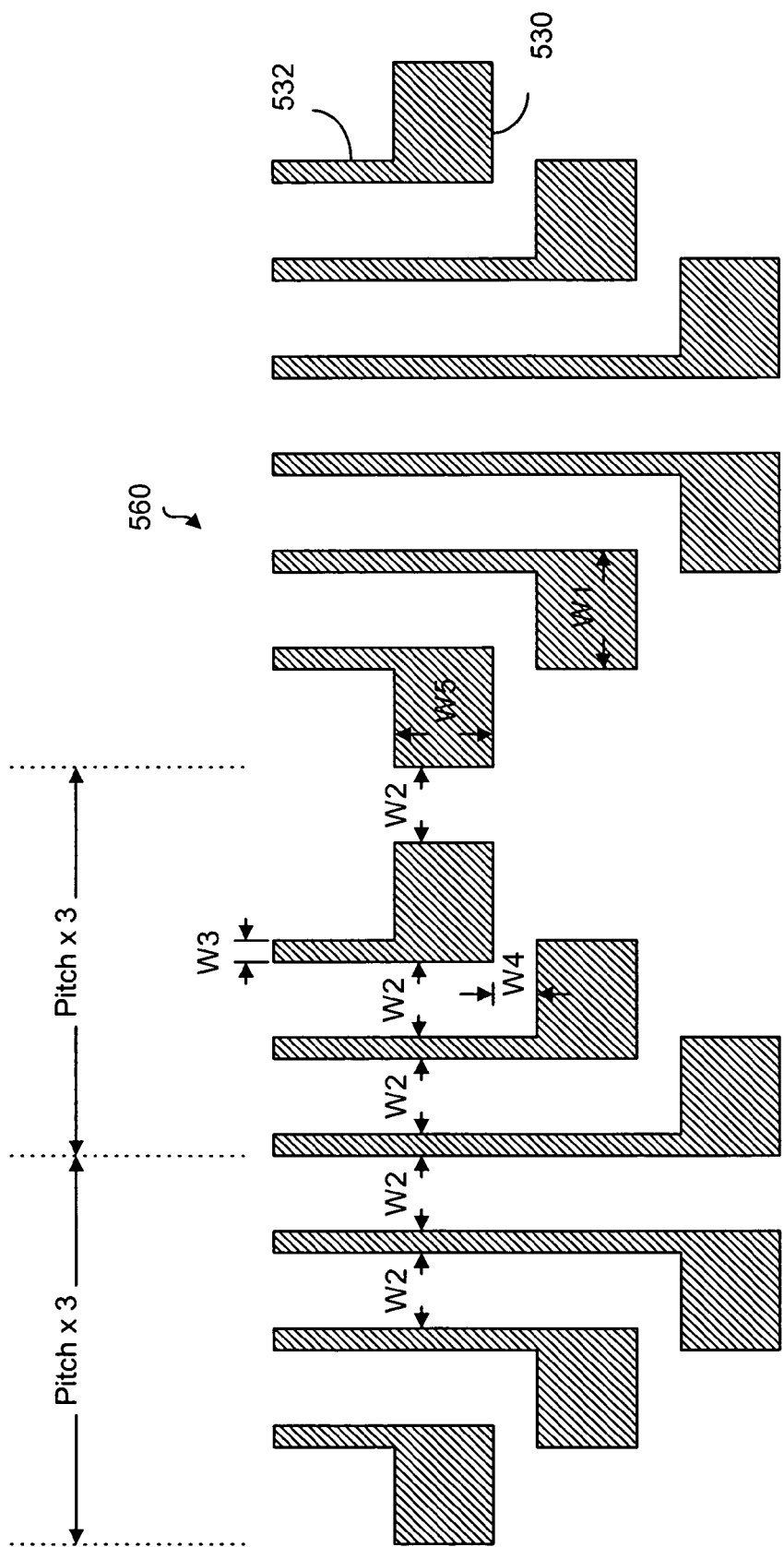
FIG. 9 shows another bump-pad layout, according to the present invention.

FIG. 9 shows a variation in connection pattern, according to the present invention. In the connection pattern 560, each group of connector is a mirror image of an adjacent group. However, the relationship between the pitch, the width of the bump pad, the width of the strip segment and the gap between two adjacent connectors is the same.

Figure 10:
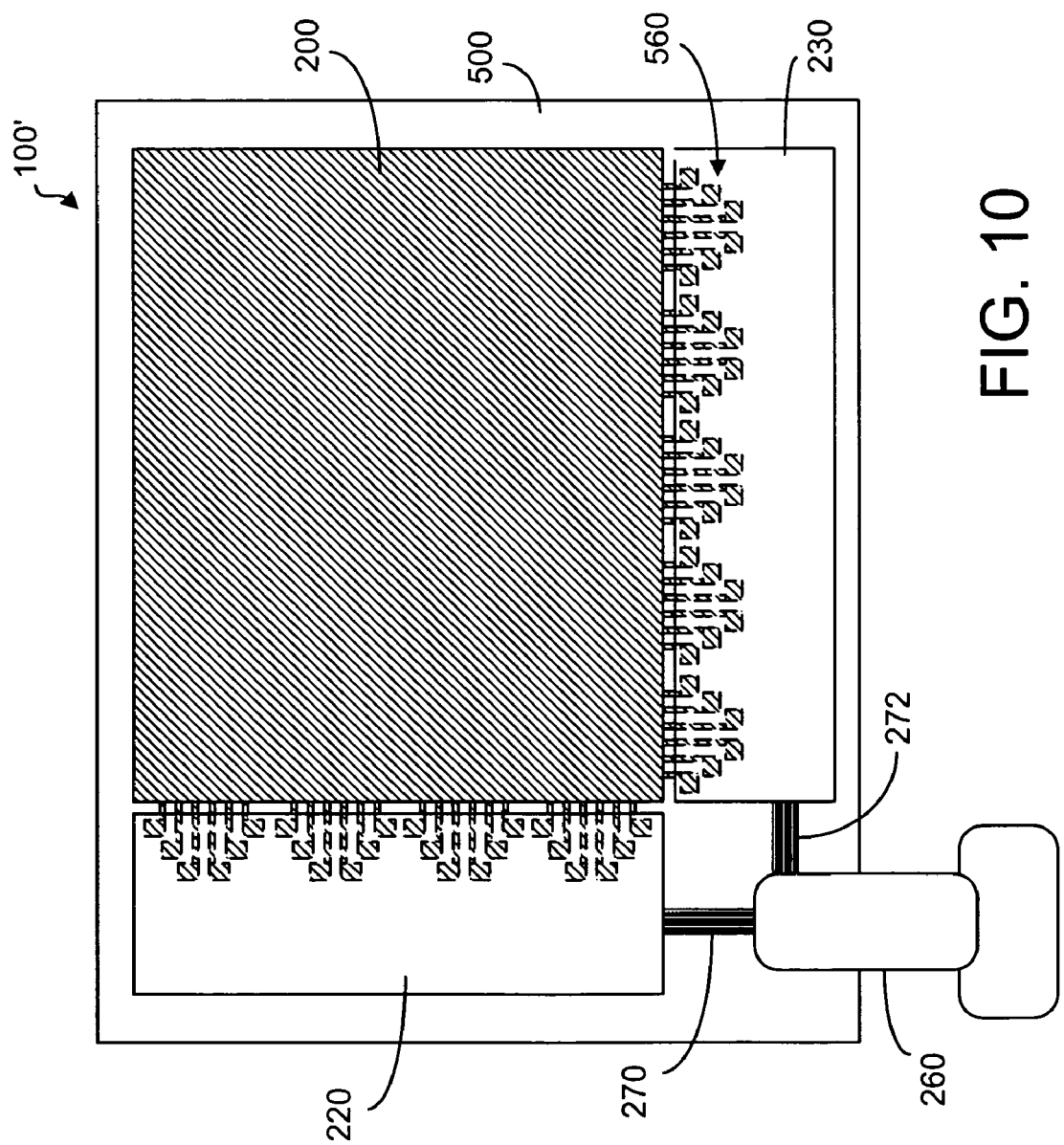
FIG. 10 shows a finished LCD panel with the other bump pad layout, according to the present invention.

FIG. 10 shows a finished LCD display 100' with the connection pattern 560.

It should be noted that, in general, the relationship between the pitch, P, and the other relevant dimensions is given by:

$$P=(W_1+n\times W_2+(n-1)\times W_3)/n,$$

where n is the number of connectors in a group of connectors. According to the present invention, n is equal to or greater than 3. If we arrange the connected connectors in groups of four, then $$P=(W_1+4\times W_2+3\times W_3)/4.$$

With $W_1$=23 μm, $W_2$=7 μm and $W_3$=5 μm, we have P=16.5 μm. While it is possible to fabricate more lines on a given width of the substrate, it requires more area because of the increased length of the connection pattern.

Figure 11:
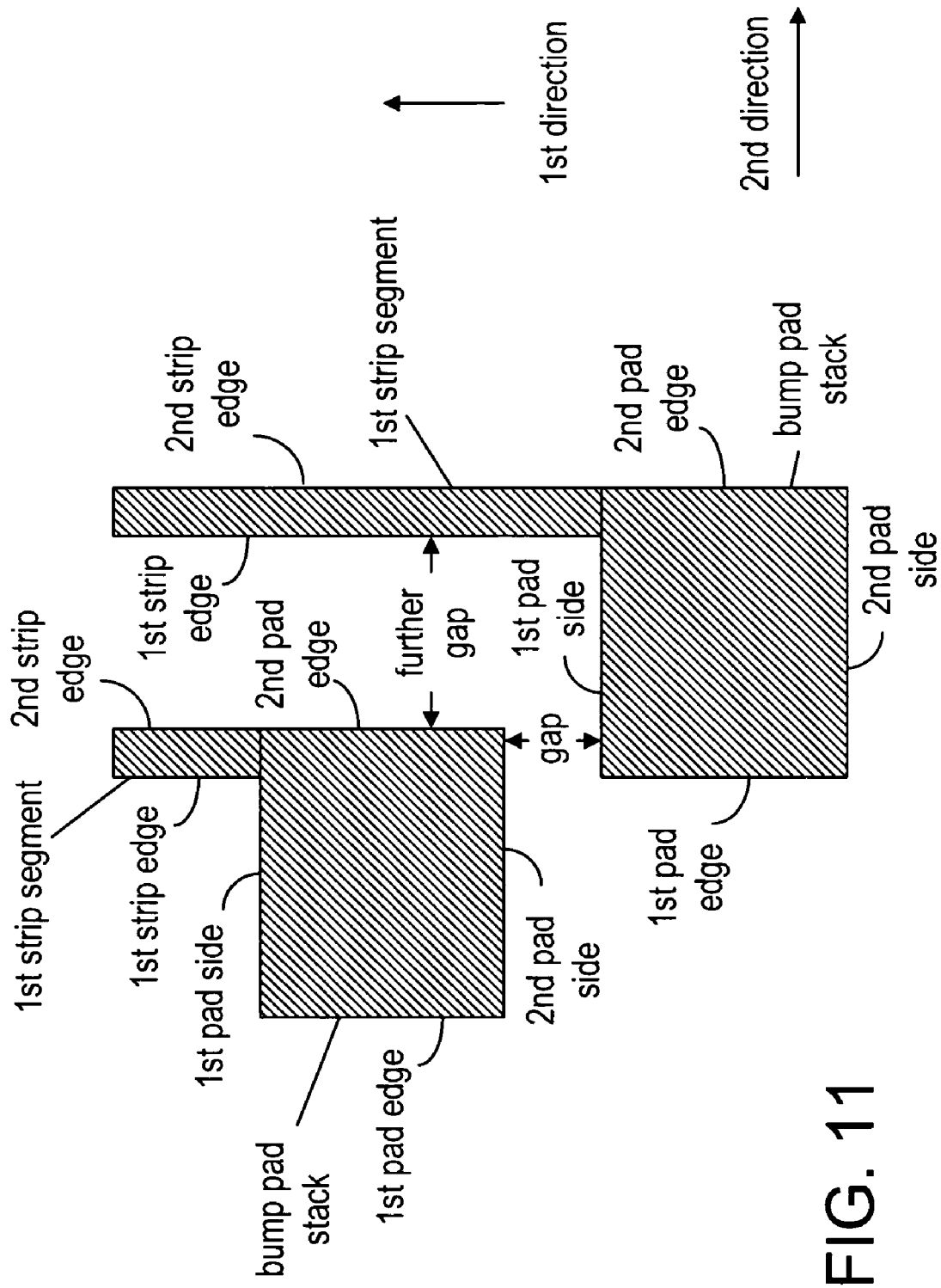
FIG. 11 shows the detailed relationship between various strip segments and the bump pads, according to the present invention.

In sum, the present invention provides a method to improve electrical connection layout efficiency in an electronic panel having a first device and a second device, wherein the first device comprises a plurality of electrically conductive strip segments and a plurality of first electrically conductive pads, and the second device comprises a plurality of second electrically conductive pads complementary to the first electrically conductive pads. As can be seen in FIG. 11, when the first pads are superimposed on corresponding second pads to form a plurality of pad stacks, the pad stacks together with the strip segments form a connection pattern between the first device and the second device, wherein each pad stack has an area bound by a first pad side and a second pad side in a first direction, and by a first pad edge and a second pad edge in a second direction, and each of the first and second strip segments has a first strip edge and an opposing second strip edge, wherein each pad stack is electrically connected to one strip segment on the first pad side, and wherein on each pad, the strip segments are arranged relative to the pad such that the first strip edge of the second strip segment is substantially aligned with the first pad edge, and the plurality of pad stacks in the connection pattern are arranged into one or more groups, each group having at least three pad stacks, wherein, in each group, the pad stacks are displaced from each other both in the first direction and in the second direction such that a gap is formed in the first direction between the second pad side of one pad stack and the first pad side of an adjacent pad stack, and a further gap is formed in the second direction between the second pad edge of said pad stack and the first strip edge of the strip segment connected to said adjacent pad stack.

The groups in the connection pattern are arranged in a repetitive fashion such that each group is similar to the other groups. Alternatively, the groups in the connection pattern are arranged such that one group is the mirror image of an adjacent group.

Figure 12:
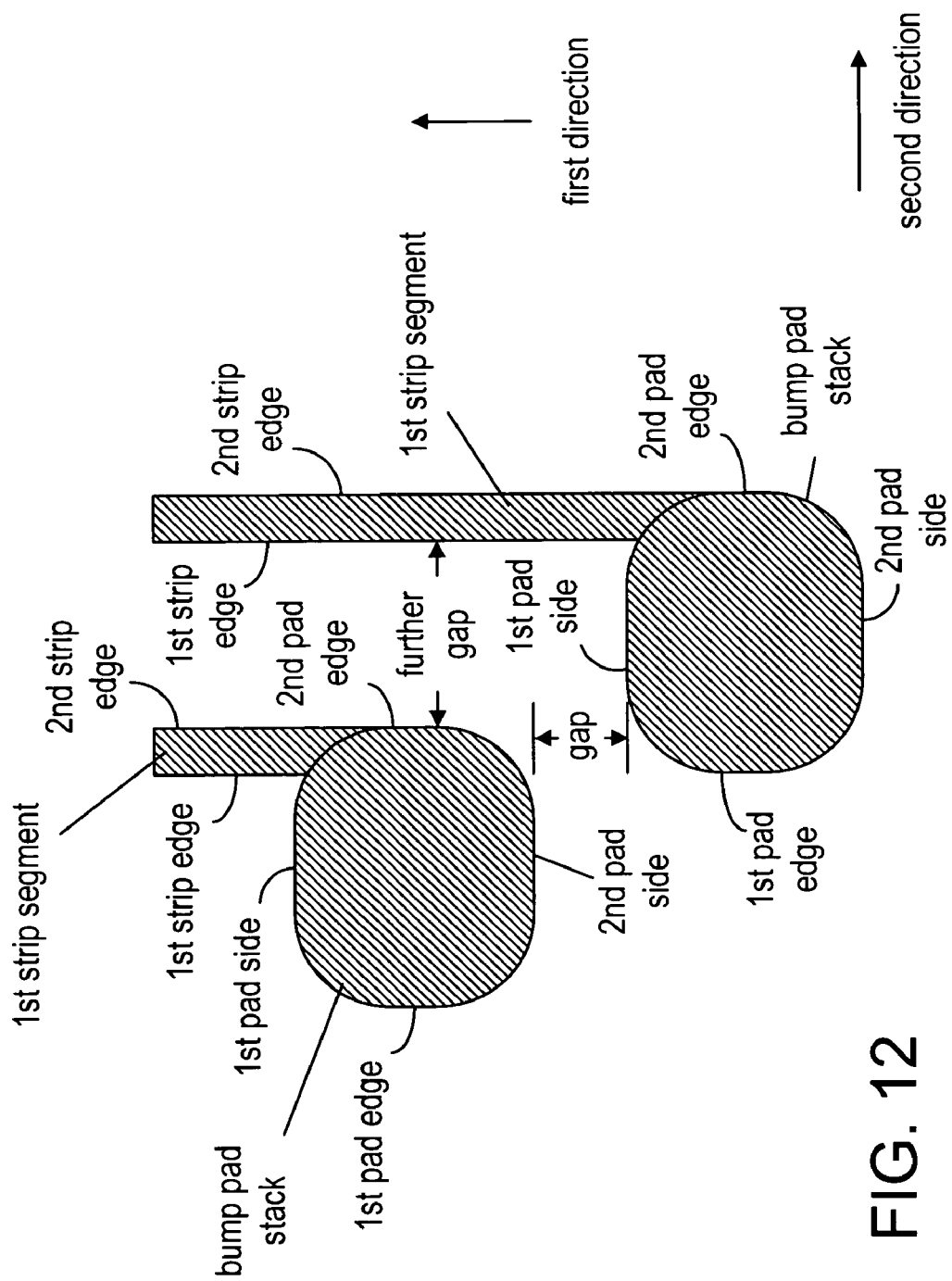
FIG. 12 shows the electrical connection with a different bump pad.

It should also be appreciated that the bump pads do not have to be perfectly rectangular although a rectangular pad of a certain width and a certain length has the largest area. Nevertheless, the present invention is also applicable to bump pads of other shapes. For example, the bump pads can have one or more rounded corners, as shown in FIG. 12.

Figure 13:
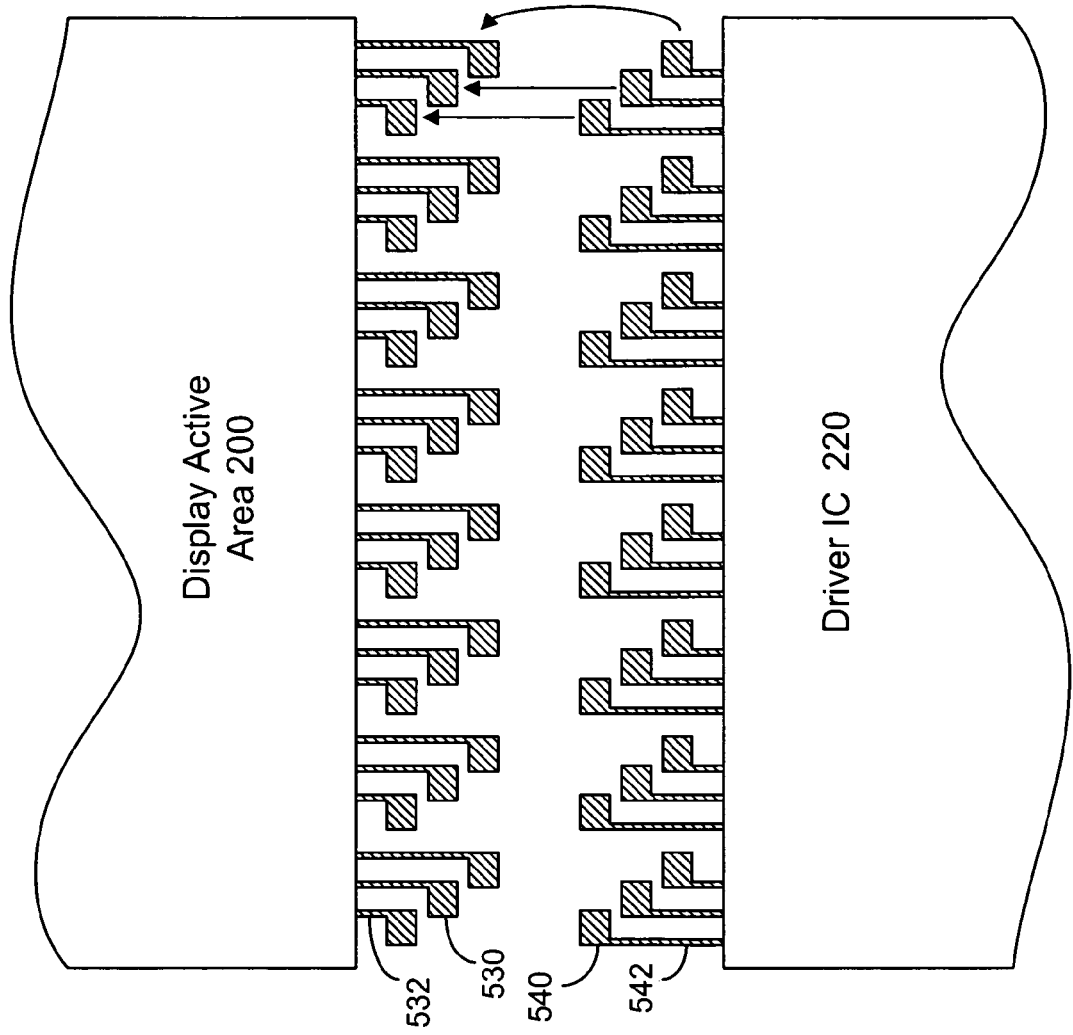
FIG. 13 shows a different embodiment of the present invention where both of the connected devices have a plurality of strip segments connected to a plurality of bump pads.

Furthermore, it is also possible that both the first device and the second device have a plurality of strip segments connected to a plurality of pads, with the strip segments and the pads of the second device being complementary to the strip segments and the pads of the first device, as shown in FIG. 13.

Thus, although the present invention has been described and illustrated with respect to exemplary embodiments thereof, the foregoing and various other additions and omissions may be made therein without departing from and scope of the present invention.

What is claimed is:

1. A method for use in an electronic panel having a first electronic device and a second electronic device, said method comprising:

disposing on the first electronic device a plurality of electrically conductive strip segments and a plurality of first electrically conductive pads;

disposing on the second electronic device a plurality of second electrically conductive pads complementary to the first electrically conductive pads, such that when the first pads are superimposed on corresponding second pads to form a plurality of pad stacks, the pad stacks together with the strip segments form a connection pattern between the first electronic device and the second electronic device, wherein each pad stack has an area bound by a first pad side and a second pad side in a first direction, and by a first pad edge and a second pad edge in a second direction, and each of the strip segments has a first strip edge and an opposing second strip edge, each pad stack electrically connected to one strip segment on the first pad side; and arranging the pad stacks in the connection pattern into a plurality of stack groups, at least some of the stack groups having at least three pad stacks, wherein the second strip edge of the strip segment on each pad stack in said at least some of the stack groups is substantially aligned with the second pad edge, and said at least three pad stacks are displaced from each other both in the first direction and in the second direction such that a gap is formed in the first direction between the second pad side of one pad stack and the first pad side of an adjacent pad stack, and a further gap is formed in the second direction between the second pad edge of said pad stack and the first strip edge of the strip segment connected to said adjacent pad stack.

2. The method of claim 1, wherein said plurality of stack groups further comprises one or more other stack groups, each of said other stack groups having at least three pad stacks, wherein the first strip edge of the strip segment on each pad stack in said one or more other stack groups is substantially aligned with the first pad edge, and said at least three pad stacks are displaced from each other both in the first direction and in the second direction.

3. The method of claim 2, wherein the stack groups and the other stack groups are arranged in an alternate pattern.

4. The method of claim 1, wherein the first electronic device comprises a liquid crystal display having an active area, and wherein the plurality of electrically conductive strip segments are electrically connected to the active area.

5. The method of claim 4, wherein the second electronic device comprises a driver integrated circuit.

6. The method of claim 4, wherein some of the plurality of electrically conductive strip segments are used to provide signals to gate lines in the liquid crystal display, and the second electronic device comprises a gate driver.

7. The method of claim 4, wherein some of the plurality of electrically conductive strip segments are used to provide signals to data lines in the liquid crystal display, and the second electronic device comprises a data driver.

8. An electronic panel comprising:

a first electronic device;

a second electronic device; and an electrical connector electrically connecting the first electronic device to the second electronic device, said electrical connector comprising:

a plurality of first electrically conductive bump pads and a plurality of electrically conductive strip segments connected between the first electrically conductive bump pads and the first electronic device; and a plurality of second electrically conductive bump pads complementary to the first electrically conductive bump pads electrically connected to the second electronic device, such that when the first pads are superimposed on corresponding second pads to form a plurality of pad stacks, the pad stacks together with the strip segments form a connection pattern between the first electronic device and the second electronic device, wherein each pad stack has an area bound by a first pad side and a second pad side in a first direction, and by a first pad edge and a second pad edge in a second direction, and each of the strip segments has a first strip edge and an opposing second strip edge, each pad stack electrically connected to one strip segment on the first pad side, and wherein the pad stacks in the connection pattern are arranged into a plurality of stack groups, at least some of the stack groups having at least three pad stacks, with the second strip edge of the strip segment on each pad stack in said at least some of the stack groups substantially aligned with the second pad edge, and said at least three pad stacks are displaced from each other both in the first direction and in the second direction such that a gap is formed in the first direction between the second pad side of one pad stack and the first pad side of an adjacent pad stack, and a further gap is formed in the second direction between the second pad edge of said pad stack and the first strip edge of the strip segment connected to said adjacent pad stack.

9. The electronic panel of claim 8, wherein said plurality of stack groups further comprises one or more other stack groups, each of said other stack groups having at least three pad stacks, wherein the first strip edge of the strip segment on each pad stack in said one or more other stack groups is substantially aligned with the first pad edge, and said at least three pad stacks are displaced from each other both in the first direction and in the second direction.

10. The electronic panel of claim 9, wherein the stack groups and the other stack groups are arranged in an alternate pattern.

11. The electronic panel of claim 8, wherein the first electronic device comprises a liquid crystal display having an active area, and wherein the plurality of electrically conductive strip segments are electrically connected to the active area.

12. The electronic panel of claim 11, wherein the second electronic device comprises a driver integrated circuit.

13. The electronic panel of claim 11, wherein some of the plurality of electrically conductive strip segments are used to provide signals to gate lines in the liquid crystal display, and the second electronic device comprises a gate driver.

14. The electronic panel of claim 11, wherein some of the plurality of electrically conductive strip segments are used to provide signals to data lines in the liquid crystal display, and the second electronic device comprises a data driver.

* * * * *